(12) United States Patent
Nakaya et al.

(10) Patent No.: US 8,132,707 B2
(45) Date of Patent: Mar. 13, 2012

(54) FLOW SOLDERING APPARATUS AND FLOW SOLDERING METHOD USING A WATER CONTENT SENSOR

(75) Inventors: Kimiaki Nakaya, Osaka (JP); Kenichiro Suetsugu, Hyogo (JP); Arata Kishi, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/867,340

(22) PCT Filed: Apr. 10, 2009

(86) PCT No.: PCT/JP2009/001661
§ 371 (c)(1),
(2), (4) Date: Aug. 12, 2010

(87) PCT Pub. No.: WO2009/125601
PCT Pub. Date: Oct. 15, 2009

(65) Prior Publication Data
US 2011/0031297 A1    Feb. 10, 2011

(30) Foreign Application Priority Data
Apr. 10, 2008  (JP) ................. 2008-102272

(51) Int. Cl.
B23K 13/08      (2006.01)
B23K 1/08       (2006.01)
B23K 31/12      (2006.01)
B23K 31/02      (2006.01)
(52) U.S. Cl. ............... 228/8; 228/103; 228/37; 228/260
(58) Field of Classification Search .................. 228/102, 228/103, 256, 260, 8, 37
See application file for complete search history.

(56) References Cited

U.S. PATENT DOCUMENTS

| | | | | |
|---|---|---|---|---|
| 4,855,007 A * | 8/1989 | Baxter et al. | .............. | 156/378 |
| 5,179,282 A * | 1/1993 | Modinger | .............. | 250/343 |
| 5,379,943 A * | 1/1995 | Gibson | .............. | 228/20.1 |
| 6,409,070 B1 * | 6/2002 | Master et al. | .............. | 228/102 |
| 2006/0125081 A1 | 6/2006 | Kamada et al. | | |

FOREIGN PATENT DOCUMENTS

| | | |
|---|---|---|
| JP | 07-162139 | 6/1995 |
| JP | 08-229674 | 9/1996 |
| JP | 2005-203582 | 7/2005 |
| JP | 2006-165425 | 6/2006 |

OTHER PUBLICATIONS

International Search Report of PCT/JP2009/001661, dated May 19, 2009.

* cited by examiner

*Primary Examiner* — Kiley Stoner
*Assistant Examiner* — Carlos Gamino
(74) *Attorney, Agent, or Firm* — Hamre, Schumann, Mueller & Larson, P.C.

(57) ABSTRACT

The present invention provides a flow soldering apparatus that can suppress the occurrence of soldering defects, even if VOC-free flux or low-VOC flux is applied to an electronic circuit substrate. In other words, the flow soldering apparatus according to the present invention includes: a water content sensor for measuring a residual water content of a surface of a substrate; and a monitoring device for judging whether soldering quality is satisfactory or not by using a residual water content value of the surface of the substrate acquired from the residual water content measured by the water content sensor, on the basis of a correlation between a residual water content value of a surface of a sample substrate and a residual water content value of through holes of the sample substrate, as acquired previously by using a plurality of substrate samples.

16 Claims, 9 Drawing Sheets

FLOW SOLDERING APPARATUS AND FLOW SOLDERING METHOD USING A WATER CONTENT SENSOR

TECHNICAL FIELD

The present invention relates to a flow soldering apparatus and flow soldering method suitable for VOC-free flux or low-VOC flux. VOC is an abbreviation of Volatile Organic Compounds.

BACKGROUND ART

Flow soldering is a technology for soldering electronic components onto an electronic circuit substrate. An overview of this is explained below. Firstly, the electronic components are mounted on one main surface of the electronic circuit substrate. The leads of the mounted electronic component are inserted into through holes in the electronic circuit substrate and project out from the other main surface of the electronic circuit substrate. Molten solder makes contact with the surface where the leads project, thereby soldering the electronic component to the electronic circuit substrate. Below, one of main surfaces where the electronic component is mounted is called the component surface and the other one of main surfaces with which molten solder makes contact is called the soldering surface.

A flow soldering apparatus comprises processing devices, such as a fluxer, a pre-heater, a jet solder tank, a cooler, and the like. The fluxer, pre-heater, jet solder tank and cooler are disposed in this order facing the direction of conveyance of the electronic circuit substrate. The electronic circuit substrate is introduced into this flow soldering apparatus. As described above, an electronic component is mounted previously on the electronic circuit substrate which is introduced into the apparatus, and the leads of the mounted electronic component project from the soldering surface. The electronic circuit substrate introduced into the apparatus is conveyed by a conveyor which is disposed in the flow soldering apparatus. When the electronic circuit substrate is introduced into the flow soldering apparatus, firstly, flux is applied by the fluxer to the soldering surface of the electronic circuit substrate that has been introduced. Thereupon, the electronic circuit substrate onto which flux has been applied is preheated by the pre-heater. Next, molten solder at a high temperature is applied by the jet solder tank to the soldering surface of the electronic circuit substrate which has been preheated. Thereupon, the electronic circuit substrate to which the molten solder has been applied is cooled by the cooler. By means of these steps, an electronic component is soldered onto the electronic circuit substrate.

As described above, flux is applied to the soldering surface from which the leads project, whereupon the molten solder makes contact with the soldering surface. Flux is applied in order to remove oxide film and dirt which may adhere to the soldering surface. In general, liquid flux is used in soldering. Liquid flux includes a solvent and an active material, such as rosin, which is dissolved in this solvent. The fluxer which applies the liquid flux to the soldering surface of the electronic circuit substrate may be a foam fluxer, spray fluxer, or the like. The pre-heater preheats the flux that has been applied to the soldering surface, to a temperature of 100 to 150 degrees C. Due to this preheating, the active material performs its action and cleans the soldering surface of the electronic circuit substrate. If preheating is not carried out, then the soldering surface is not cleaned. Furthermore, a solvent for dissolving the active material is used in the liquid flux. If this solvent remains on the soldering surface of the electronic circuit substrate, then soldering of good quality cannot be achieved. In order to remove solvent, it is necessary to carry out preheating by means of a preheater.

The active material, such as rosin, dissolves well in alcohols, such as isopropyl alcohol. Therefore, an alcohol has been used in the solvent of the flux. However, if a volatile organic compound (VOC) such as alcohol escapes into the atmosphere, then the volatile organic compound is decomposed by ultraviolet energy, or the like, and creates radicals. These radicals are a cause of photochemical smog, or the like. Therefore, in Japan, the use of VOC is to be restricted from the year 2010, due to the amended Air Pollution Control Act. These restrictions will also apply to the field of soldering. For reasons of this kind, liquid VOC-free flux which does not use VOC as a solvent, and liquid low-VOC flux which has a reduced content of VOC have been developed. Low-VOC flux generally contains not more than 5 wt % of VOC.

If liquid flux which uses an alcohol having a low boiling point as the solvent is applied to the soldering surface, then the solvent evaporates if preheating is carried out at a temperature of 100 to 150 degrees C. On the other hand, VOC-free flux and low-VOC flux which have been developed recently use water which is less volatile than alcohols as the solvent. The water used as a solvent is difficult to remove completely before the molten solder makes contact with the electronic circuit substrate, at a preheating temperature of 100 to 150 degrees C. Consequently, when molten solder having a high temperature is applied by the jet solder tank onto the electronic circuit substrate onto which the VOC-free flux or low-VOC flux has been coated, problems arise, such as the occurrence of solder balls, solder wetting defects, solder bridging, or the like. Consequently, if VOC-free flux or low-VOC flux is applied, then it has not been possible to obtain a finish equivalent to that obtained when VOC flux which uses an alcohol as the solvent is applied. For reasons of this kind, technology has been proposed for eliminating the water content from the electronic circuit substrate before the molten solder is applied to the electronic circuit substrate by the jet solder tank.

For example, Patent Literature 1 discloses a flow soldering apparatus which comprises a preheating device disposed before a fluxer. This flow soldering apparatus preheats the electronic circuit substrate to a temperature of 100 to 200 degrees C. by means of the preheating device, and applies the liquid flux from the fluxer onto the preheated electronic circuit substrate. With this flow soldering apparatus, the water content in the applied flux is evaporated off by the heat of the electronic circuit substrate.

Patent Literature 2 discloses a flow soldering apparatus which comprises a hot air drying device provided between a fluxer and a jet solder tank. This flow soldering apparatus evaporates the water content included in the applied flux by directing hot air onto the electronic circuit substrate to which liquid flux has been applied.

Incidentally, it is difficult to remove completely the water content in the through holes of the electronic circuit substrate, and even if the surface of the electronic circuit substrate is dried, moisture remains in the through holes. Therefore, even when the surface of the electronic circuit substrate is dried, if there is a large amount of water in the through holes, then the water content in the through holes is converted into water vapor by the heat of the molten solder, and the molten solder is scattered about by this water vapor. However, until now, the preheating profiles of flow soldering apparatuses have not been set by taking account of the moisture in the through holes. Consequently, with the flow soldering apparatuses described above, there is a risk that soldering defects may occur.

Furthermore, there is variation in the water content contained previously in the respective electronic circuit substrates which are introduced into a flow soldering apparatus, and there is also variation in the state of application of the flux by the fluxer. The flow soldering apparatuses described above are not able to determine the amount of water contained in the electronic circuit substrate which is the work object. Hence, there is a risk that due to variations of this kind, an electronic circuit substrate from which the water content has not been removed sufficiently may be conveyed into the jet solder tank. If the water content is not removed sufficiently, then the molten solder is scattered. Consequently, with the flow soldering apparatuses described above, there is a risk that soldering defects may occur.

CITATION LIST

Patent Literature

PTL 1 Japanese Patent Application Laid-Open Publication No. H8-229674
PTL 2 Japanese Patent Application Laid-Open Publication No. H7-162139

SUMMARY OF INVENTION

Technical Problem

An object of the present invention is to provide a flow soldering apparatus and flow soldering method whereby the occurrence of soldering defects can be suppressed, even if VOC-free flux or low-VOC flux is applied to an electronic circuit substrate.

Solution to Problem

In order to achieve the aforementioned object, a flow soldering apparatus relating to the present invention includes: a conveyor for conveying a substrate in which a plurality of through holes are formed; a dispenser for applying flux to the substrate; a soldering unit for applying molten solder to the substrate to which the flux has been applied; a preheating device for preheating the substrate by the time the substrate is conveyed to the soldering unit; a water content sensor for measuring a residual water content of a surface of the substrate; and a monitoring device for judging soldering quality by using a residual water content value of the surface of the substrate acquired from the residual water content measured by the water content sensor, on the basis of a correlation between a residual water content value of a surface of a sample substrate and a residual water content value of through holes of the sample substrate.

In the flow soldering apparatus according to the present invention described above, the monitoring device may adjust a heating temperature of the preheating device by using the residual water content value of the surface of the substrate as acquired from the residual water content measured by the water content sensor, on the basis of the correlation.

In the flow soldering apparatus according to the present invention described above, the residual water content value of the through holes of the sample substrate may be acquired by using cylindrical jigs which have been inserted into the through holes of the sample substrate. The material of the cylindrical jigs may be an acrylic resin or polyvinyl resin or cotton.

In the flow soldering apparatus according to the present invention described above, the preheating device includes a first preheater disposed before the dispenser and a second preheater disposed after the dispenser; the water content sensor includes a first water content sensor for measuring a residual water content of the surface of the substrate preheated by the first preheater, and a second water content sensor for measuring a residual water content of the surface of the substrate preheated by the second preheater; and the monitoring device may acquire a difference between the residual water contents measured respectively by the first water content sensor and the second water content sensor, as a residual water content value of the surface of the substrate. In this case, the residual water content value of the through holes of the sample substrate may be the difference between the residual water content measured by the first water content sensor from first cylindrical jigs previously inserted into first through holes of the sample substrate preheated by the first preheater and the residual water content measured by the second water content sensor from second cylindrical jigs previously inserted into second through holes of the sample substrate preheated by the second preheater. The material of the first and second cylindrical jigs may be an acrylic resin or polyvinyl resin or cotton.

In the flow soldering apparatus according to the present invention described above, the water content sensor may be a near-infrared sensor or infrared sensor.

In the flow soldering apparatus according to the present invention described above, the flux may be VOC-free flux or low-VOC flux.

In order to achieve the aforementioned object, a flow soldering method relating to the present invention includes the steps of: applying flux to an introduced substrate; applying molten solder to the substrate to which the flux has been applied; preheating the substrate by the time the molten solder is applied to the substrate; and judging, before molten solder is applied to the substrate, soldering quality from a residual water content value of a surface of the substrate, on the basis of a correlation between a residual water content value of a surface of a sample substrate and a residual water content value of through holes of the sample substrate.

In the flow soldering method according to the present invention described above, in judging soldering quality, a preheating profile of the substrate may be adjusted in accordance with the residual water content value of the surface of the substrate, on the basis of the correlation.

In the flow soldering method according to the present invention described above, the residual water content value of the surface of the substrate may be a difference between a residual water content measured from the surface of the preheated substrate before the application of flux and a residual water content measured from the surface of the preheated substrate after the application of flux.

In the flow soldering method according to the present invention described above, the residual water content value of the through holes of the sample substrate may be acquired by using cylindrical jigs which have been inserted into the through holes of the sample substrate. Alternatively, the residual water content value of the through holes of the sample substrate may be acquired from a difference between a residual water content measured from first cylindrical jigs previously inserted into first through holes of the sample substrate that has been preheated before the application of flux and a residual water content measured from second cylindrical jigs previously inserted into second through holes of the sample substrate that has been preheated after the application of flux. The material of the cylindrical jigs used to acquire the residual water content value of the through holes of the sample substrate may be an acrylic resin or polyvinyl resin or cotton.

In the flow soldering method according to the present invention described above, the residual water content value of the surface of the substrate, the residual water content value of the surface of the sample substrate and the residual water content value of the through holes of the sample substrate may be acquired using a near-infrared sensor or infrared sensor.

In the flow soldering method according to the present invention described above, the flux may be VOC-free flux or low-VOC flux.

ADVANTAGEOUS EFFECTS OF INVENTION

According to the desirable modes of the present invention, it is possible to judge soldering quality, from the residual water content value on the surface of the substrate forming the work object, on the basis of the correlation between the residual water content value in the through holes of a sample substrate and the residual water content value on the surface of the sample substrate. Consequently, it is possible to remove a substrate having defective soldering quality, from the flow soldering line. Moreover, it is also possible to adjust the preheating profile. Consequently, even if VOC-free flux or low-VOC flux is applied to an electronic circuit substrate, it is possible to suppress the occurrence of soldering defects and hence good soldering quality is ensured.

DESCRIPTION OF EMBODIMENTS

Figure 1:
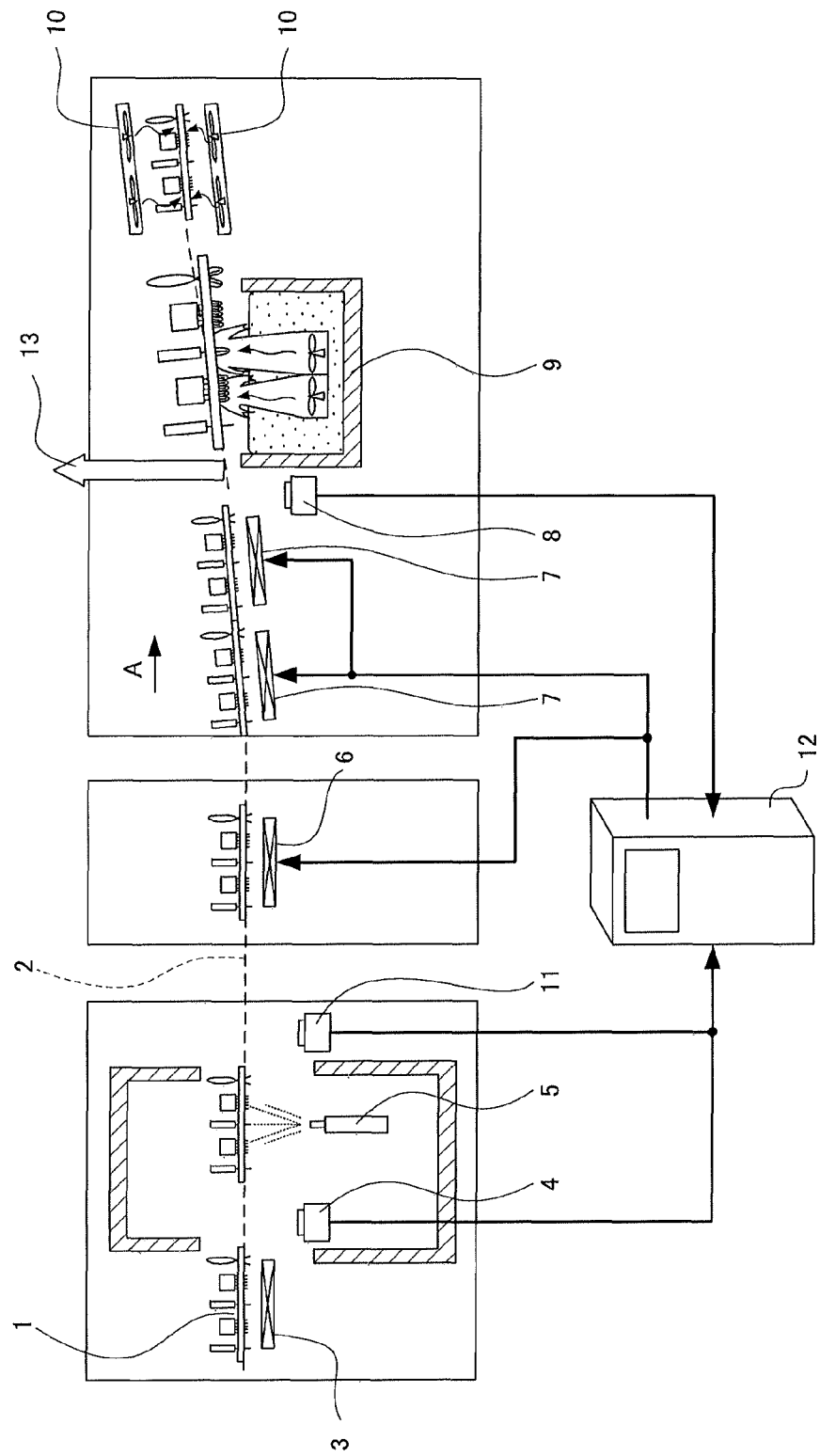
FIG. 1 is a diagram showing one example of the composition of a flow soldering apparatus according to an embodiment of the present invention.

FIG. 1 is a diagram showing one example of the composition of a flow soldering apparatus according to an embodiment of the present invention. A water content sensor is incorporated into the flow soldering line, and the preheating profile is controlled by feedback control on the basis of a signal supplied from the water content sensor. Firstly, an overview of the composition of the present flow soldering apparatus is described.

As shown in FIG. 1, an electronic circuit substrate 1 formed with a plurality of through holes is introduced into this flow soldering apparatus. An electronic component is mounted previously onto the component surface of the electronic circuit substrate 1 which is introduced into the apparatus. The leads of the electronic component mounted on the substrate are inserted into the through holes of the electronic circuit substrate 1 and project from the soldering surface.

A conveyor 2 is provided in the flow soldering apparatus for conveying the introduced electronic circuit substrate 1. Moreover, in this flow soldering apparatus, a first preheater 3 which is a first preheating device, a first water content sensor 4, a fluxer 5 which is a dispenser, a drying device 6 and a second preheater 7, which are second preheating devices, a second water content sensor 8, a jet solder tank 9 which is a soldering unit, and a cooler 10, are provided in this order following the direction of conveyance of the electronic circuit substrate 1. Furthermore, this flow soldering apparatus comprises a third water content sensor 11 disposed between the fluxer 5 and the drying device 6. Moreover, this flow soldering apparatus comprises a monitoring device 12.

The first preheater 3 preheats the electronic circuit substrate 1. The first water content sensor 4 measures the water content of the soldering surface of the electronic circuit substrate 1 that has been preheated by the first preheater 3. The fluxer 5 applies flux to the soldering surface of the electronic circuit substrate 1. VOC-free flux or low-VOC flux is used as the flux. Low-VOC flux contains 5 wt % or less of VOC, for example. The third water content sensor 11 measures the water content of the soldering surface of the electronic circuit substrate 1 to which flux has been applied. The drying device 6 evaporates off the water contained in the flux that has been applied to the electronic circuit substrate 1. The second preheater 7 preheats the electronic circuit substrate 1. The second water content sensor 8 measures the water content of the soldering surface of the electronic circuit substrate 1 that has been preheated by the second preheater 7. The jet solder tank 9 applies molten solder to the soldering surface of the electronic circuit substrate 1 by bringing a spray of the molten solder at high temperature into contact with the soldering surface on which flux has been deposited. The cooler 10 cools the electronic circuit substrate 1 onto which molten solder has been applied.

The monitoring device 12 stores a correlation between the residual water content value of the soldering surface of a sample substrate and the residual water content value of the through holes of the sample substrate, which are acquired previously using a plurality of sample substrates of electronic circuit substrates. Hereinafter, the sample substrate is abbreviated as a sample. The monitoring device 12 is composed in such a manner that it can judge soldering quality on the basis of the stored correlation, by using the residual water content value of the soldering surface of the electronic circuit substrate forming the work object as acquired from the residual water content measured by the water content sensors 4 and 8. Specifically, the monitoring device 12 forecasts whether or not the soldering quality of the electronic circuit substrate forming the work object will be satisfactory. This forecast is made before the electronic circuit substrate 1 forming the work object is conveyed into the jet solder tank 9.

The flow soldering apparatus comprises a mechanism for removing from the flow soldering line an electronic circuit substrate for which unsatisfactory soldering quality has been forecast by the monitoring device 12. This removal operation is carried out before the electronic circuit substrate that has been forecast as unsatisfactory is conveyed to the jet solder tank 9. The arrow indicated by reference numeral 13 in FIG. 1 represents the removal from the flow soldering line of an electronic circuit substrate for which unsatisfactory soldering quality has been predicted. For instance, it is possible to provide a conveyance robot which removes the electronic circuit substrate from the line. In this case, an instruction for removing from the line an electronic circuit substrate for which unsatisfactory soldering quality has been forecast may be sent to the conveyance robot by the monitoring device 12. Furthermore, it is also possible to connect a separating conveyor which removes an electronic circuit substrate from the line, to the conveyor 2. Furthermore, the monitoring device 12 may indicate that the soldering quality is unsatisfactory on a screen provided in the monitoring device 12, and an operator who sees this display can then remove the electronic circuit substrate from the flow soldering line.

Furthermore, the monitoring device 12 is composed in such a manner that the preheating profile is adjusted on the basis of the residual water content value of the soldering surface of the electronic circuit substrate, using the correlation described above. Here, the preheating temperature of the drying device 6 and the preheating temperature of the second preheater 7 are adjusted. Moreover, the monitoring device 12 is composed in such a manner that the amount of flux applied is controlled on the basis of the water content measured by the third water content sensor 11.

In this way, an electronic circuit substrate in which unsatisfactory soldering quality is forecast is removed as and when necessary from the flow soldering line, and the heating temperature of the drying device 6 and the heating temperature of the second preheater 7 are adjusted. Consequently, since the high-temperature molten solder makes contact with the electronic circuit substrate in a suitable dried state, then it is possible to achieve soldering of good quality which does not give rise to solder balls or bridging.

Next, the details of the present flow soldering apparatus will be described. For the first preheater 3, the drying device 6 and the second preheater 7, it is possible to use an infrared drying device, a hot air drying device, or a combination of these drying devices. The water content sensors 4, 8 and 11 measure the water content at the same measurement point on the soldering surface. The measurement point is selected from points which are not readily dried and where problems are liable to occur. For the water content sensors 4, 8 and 11, it is desirable to use a water content sensor based on a near-infrared reflection system or a water content sensor based on an infrared reflection system. A water content sensor based on a near-infrared reflection system or a water content sensor based on an infrared reflection system are able to measure the water content instantaneously, in terms of a numerical value. Therefore, if a water content sensor based on a near-infrared reflection system or a water content sensor based on an infrared reflection system is used, then it is possible to measure the water content without halting the conveyance of the electronic circuit substrate, and the water content can be read in as data.

The first preheater 3 removes the water previously contained in the electronic circuit substrate 1 that has been introduced into the flow soldering apparatus. The first water content sensor 4 measures the water content (residual water content: $W_0$) of the soldering surface of the electronic circuit substrate 1 that has passed the first preheater 3. The residual water content of the soldering surface of the electronic circuit substrate 1 is set to approximately 0.1 to 0.3% by the first preheater 3. The third water content sensor 11 measures the water content of the soldering surface of the electronic circuit substrate 1 to which flux has been applied (the residual water content: $W_1$). The drying device 6 evaporates off the water contained in the flux that has been applied to the soldering surface of the electronic circuit substrate 1. The second preheater 7 removes the water remaining on the electronic circuit substrate 1 and activates the flux. The second water content sensor 8 measures the water content (residual water content: $W_2$) of the soldering surface of the electronic circuit substrate 1 that has passed the second preheater 7. The water content sensors 4, 8 and 11 send signals indicating the measured residual water content to the monitoring device 12.

The monitoring device 12 is composed in such a manner that the soldering quality is forecast and the preheating profile is adjusted, on the basis of the residual water content value of the soldering surface of the electronic circuit substrate forming the work object, using the correlation described above. More specifically, the monitoring device 12 acquires, as the residual water content value of the soldering surface of the electronic circuit substrate 1, the difference $W_2-W_0$ between the residual water content $W_0$ measured by the first water content sensor 4 and the residual water content $W_2$ measured by the second water content sensor 8. This residual water content value $W_2-W_0$ represents the amount of residual water arising from the flux. The monitoring device 12 predicts the soldering quality on the basis of this residual water content value $W_2-W_0$. If it is forecast that the soldering quality will be unsatisfactory, then the monitoring device 12 causes the electronic circuit substrate for which unsatisfactory soldering quality has been forecast to be removed from the flow soldering line. Moreover, the monitoring device 12 also increases both the heating temperature of the drying device 6 and the heating temperature of the second preheater 7. However, it is necessary to determine in advance upper limit values for the heating temperature of the drying device 6 and the heating temperature of the second preheater 7, on the basis of the heat tolerance temperature of the electronic component mounted on the electronic circuit substrate, and the temperature of the electronic component is prevented from rising to or above the heat tolerance temperature.

As described above, the monitoring device 12 is composed on the basis of the correlation between the residual water content value of the soldering surface of a sample and the residual water content value of the through holes of the sample, acquired previously using a plurality of samples of electronic circuit substrates. Below, the method of acquiring the correlation between the residual water content value of the soldering surface of a sample and the residual water content value in the through holes of the sample is described.

The residual water content value of the soldering surface of the sample and the residual water content value of the through holes of the sample can be acquired by using the flow soldering apparatus according to the present embodiment which has been described above. The residual water content value of the soldering surface of the sample can be acquired by using the water content sensors during the flow soldering of the sample. In other words, the residual water content value of the soldering surface of the sample can be determined from the difference between the residual water content measured respectively by the first water content sensor 4 and the second water content sensor 8 during the flow soldering of the sample. On the other hand, since it is difficult to measure the amount of water contained in the through holes by means of a water content sensor, this amount of water is measured by the method described below.

Figure 2:
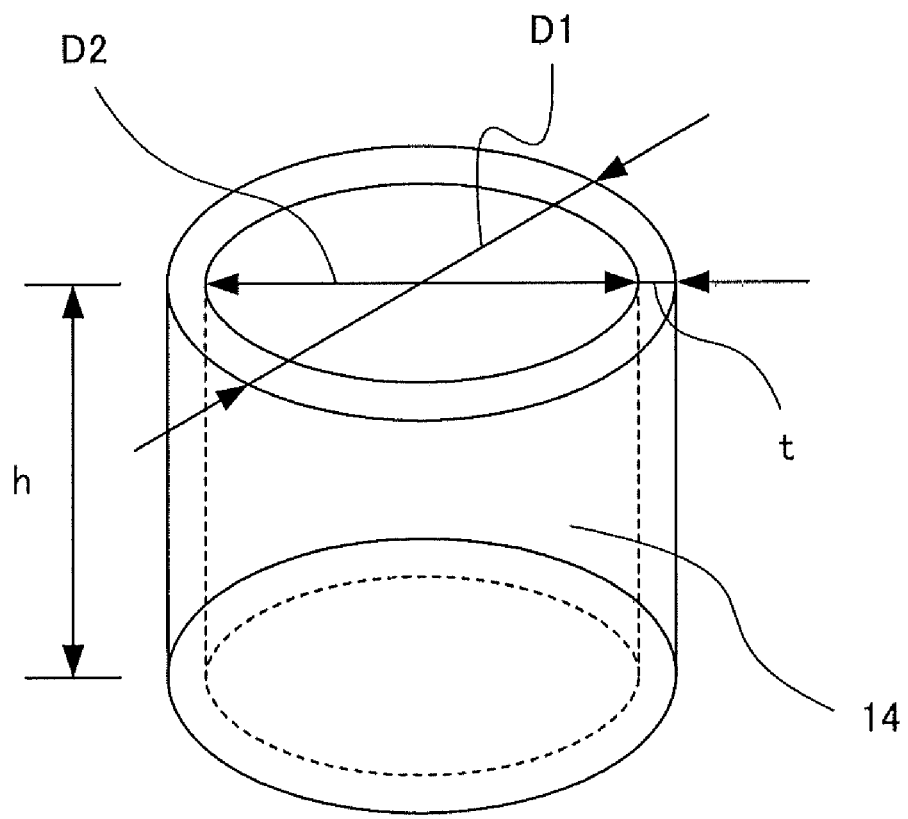
FIG. 2 is a diagram showing one example of a cylindrical jig used to measure the water content of through holes according to the embodiment of the present invention.

FIG. 2 is a diagram showing one example of a cylindrical jig which is used to measure the amount of water in the through holes according to the present embodiment; FIGS. 3A to 3G are diagrams for describing the procedure of a method of measuring the amount of water in the through holes of the electronic circuit substrate according to the present invention. This method of measurement uses a cylindrical jig 14 as shown in FIG. 2.

Figure 3A:
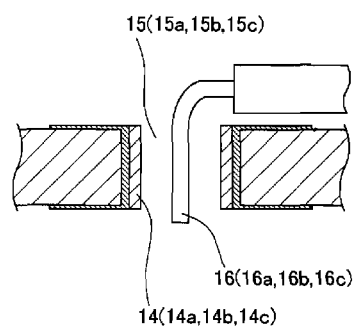
FIG. 3A is a diagram for describing one portion of the procedure of a method of measuring the water content of the through holes according to the present embodiment.
Figure 3B:
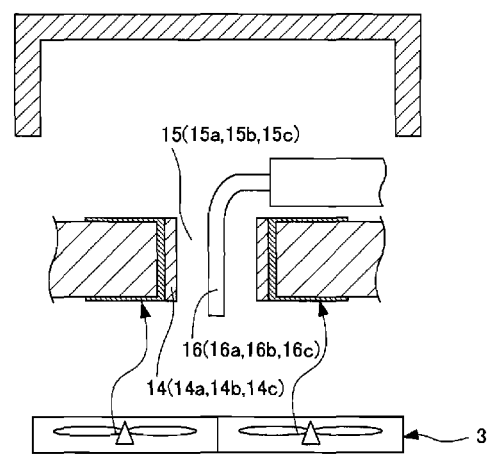
FIG. 3B is a diagram for describing one portion of the procedure of the method of measuring the water content of the through holes according to the present embodiment.
Figure 3C:
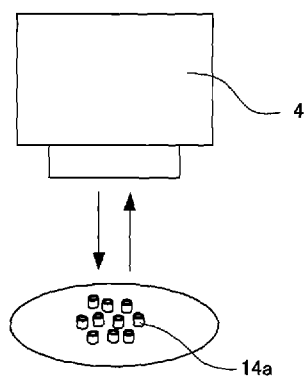
FIG. 3C is a diagram for describing one portion of the procedure of a method of measuring the water content of the through holes according to the present embodiment.

Firstly, cylindrical jigs 14 (14a to 14c) are installed in respective rough holes 15 (15a to 15c) in three similar arrangement patterns formed in a sample of an electronic circuit substrate. Next, leads 16 (16a to 16c) of an electronic component are inserted into through holes 15 (15a to 15c) in which the cylindrical jigs 14 (14a to 14c) have been installed. Refer to FIG. 3A. The sample of the electronic circuit substrate in this state is introduced into the line of the flow soldering apparatus. Firstly, the sample thus introduced is preheated by the first preheater 3. Refer to FIG. 3B. The sample is taken out from the line when it has passed the first preheater 3, the cylindrical jigs 14a installed in the through holes 15a of the first pattern are removed with tweezers, and the amount of water in the cylindrical jigs 14a thus removed are measured by the first water content sensor 4. Refer to FIG. 3C. The measurement value of the first water content sensor 4 indicates the amount of water that is thought to be absorbed previously in the cylindrical jigs 14 (14a to 14c). The measurement value of the first water content sensor 4 is taken as the initial state I0 (%).

Figure 3D:
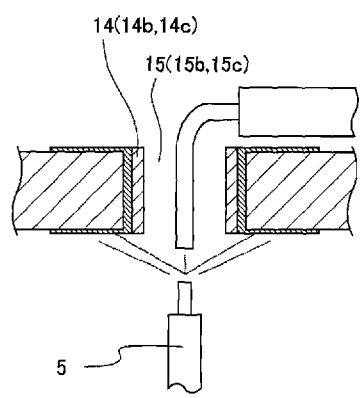
FIG. 3D is a diagram for describing one portion of the procedure of the method of measuring the water content of the through holes according to the present embodiment.
Figure 3E:
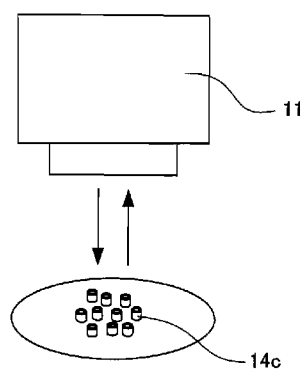
FIG. 3E is a diagram for describing one portion of the procedure of the method of measuring the water content of the through holes according to the present embodiment.

Next, the sample in which the cylindrical jigs 14a have been removed from the through holes 15a of the first pattern is then introduced again after the first preheater 3 in the line. VOC-free flux or low-VOC flux is applied from the fluxer 5 onto the sample which has been reintroduced. Refer to FIG. 3D. The sample is taken out from the line when flux has been applied, the cylindrical jigs 14c installed in the through holes 15c of the third pattern are removed with tweezers, and the amount of water in the cylindrical jigs 14c thus removed is measured by the third water content sensor 11. Refer to FIG. 3E. The cylindrical jigs 14c thus removed absorb the water contained in the applied VOC-free flux or low-VOC flux. The measurement value of the third water content sensor 11 is taken as the flux applied state I1 (%).

Figure 3F:
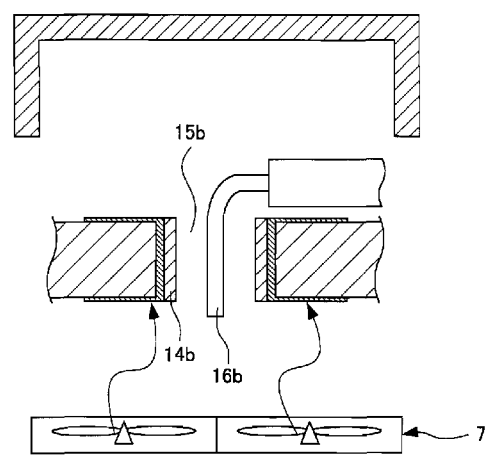
FIG. 3F is a diagram for describing one portion of the procedure of the method of measuring the water content of the through holes according to the present embodiment.
Figure 3G:
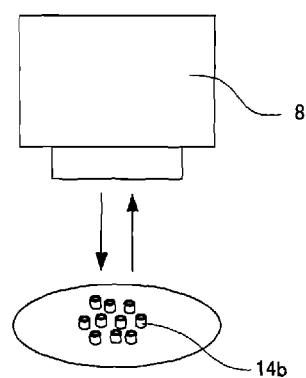
FIG. 3G is a diagram for describing one portion of the procedure of the method of measuring the water content of the through holes according to the present embodiment.

Next, the sample in which the cylindrical jigs 14c have been removed from the through holes 15c of the third pattern is then introduced again after the fluxer 5 in the line. The sample thus reintroduced passes through the drying device and is preheated by the second preheater 7. Refer to FIG. 3F. The sample is taken out from the line when it has passed the second preheater 7, the cylindrical jigs 14b installed in the through holes 15b of the second pattern are removed with tweezers, and the amount of water in the cylindrical jigs 14b thus removed are measured by the second water content sensor 8. Refer now to FIG. 3G. The measurement value of the second water content sensor 8 indicates the remaining water content which has not been evaporated off completely. The measurement value of the second water content sensor 8 is taken as the dried state I2 (%).

As described above, the initial state I0 (%) is the amount of water previously absorbed in the cylindrical jigs 14 (14a to 14c), and the flux applied state I1 (%) is the amount of water in the cylindrical jigs 14 (14a to 14c) which have absorbed the water contained in the flux. Consequently, I1-I0 is the increase in water content caused by the application of the flux. Furthermore, the dried state I2 (%) is the remaining water content that is not evaporated off completely, and I2-I0 is the residual water content value of the through holes 15 (15a to 15c). In other words, similarly to the method of measuring the residual water content value of the soldering surface, the residual water content value of the through holes can be acquired using the water content sensors 4 and 8 during the flow soldering of a sample.

In this way, the residual water content value of the through holes of the sample is acquired by using the cylindrical jigs which have been inserted into the through holes of the sample. In other words, the residual water content value of the through holes of the sample is the difference between the residual water content measured by the first water content sensor 4 from the cylindrical jigs 14a which are previously inserted into the through holes 15a of the first pattern of the sample that has been preheated by the first preheater 3, and the residual water content measured by the second water content sensor 8 from the cylindrical jigs 14b which are previously inserted into the through holes 15b of the second pattern of the sample that has been preheated by the second preheater 7.

Here, the method of measuring the residual water content value of the through holes will be described in specific terms. Here, a glass epoxy substrate having a thickness of 1.6 mm and a minimum through hole diameter of 1.0 mm is used. Moreover, the dimensions of the cylindrical jigs 14 are: height h=1.6 mm, outer diameter D1=1.0 mm, inner diameter D2=0.7 mm, thickness t=0.15 mm. Refer now to FIG. 2. The leads of the electronic component have a diameter of 0.5 mm. An acrylic resin which has elastic properties and higher water absorptivity than glass epoxy is used as the material of the cylindrical jigs 14. Here, a representative polyacrylate ester is used as the acrylic resin.

The cylindrical jigs are divided into three regions where through holes are provided in the same arrangement pattern on one sample, and the same number, for example, 10 jigs are installed in each of the regions. The cylindrical jigs are pressed into the through holes in such a manner that they do not project from the component surface or the soldering surface.

When the residual water content value of the through holes is measured in this way using a sample electronic circuit substrate in which 30 cylindrical jigs have been installed, then as shown in FIG. 3C, firstly, the initial state I0 (%) of the ten cylindrical jigs 14a removed from the through holes 15a of the first region of the sample after passing the first preheater 3 is measured, whereupon, as shown in FIG. 3E, the flux applied state I1 (%) of the ten cylindrical jigs 14c removed from the through holes 15c of the third region of the sample after the application of VOC-free flux or low-VOC flux is measured, whereupon, as shown in FIG. 3G, the dried state I2 (%) of the ten cylindrical jigs 14b removed from the through holes 15b of the second region of the sample after passing the second preheater 7 is measured.

In this way, here the water content is measured using ten cylindrical jigs made of acrylic resin. If there is only one cylindrical jig, then the water content cannot be measured accurately. On the other hand, if there are 100 cylindrical jigs, then handling takes a long time and the cylindrical jigs made of resin may dry before they are measured, and hence the dried state alters. Consequently, around ten is an appropriate number for the cylindrical jigs.

Furthermore, here, one sample is divided into three regions where through holes are provided in the same arrangement pattern, and ten cylindrical jigs are installed in each of these regions. If the positions where the cylindrical jigs are provided are in a square-shaped region, for example, then it is possible to position the jigs in the center, the four corners, the centers of each side, and any other one position. The any other one position may be a position where drying is difficult and a problem is not liable to occur. If thirty cylindrical jigs are arranged in this way, then it is possible to ascertain the average water content of the through holes of the electronic circuit substrate.

The cylindrical jigs are extremely small. Therefore, it is possible to measure the water content of the ten cylindrical jigs after they have been introduced into a transparent container. Furthermore, here, polyacrylate ester which is a typical acrylic resin is used as the material of the cylindrical jigs, but the material is not limited to this and it is also possible to use methyl polymethacrylate, or vinylon, which are transparent resins that have good water absorptivity. Moreover, it is also possible to use a cotton material having high absorptivity.

Figure 4:
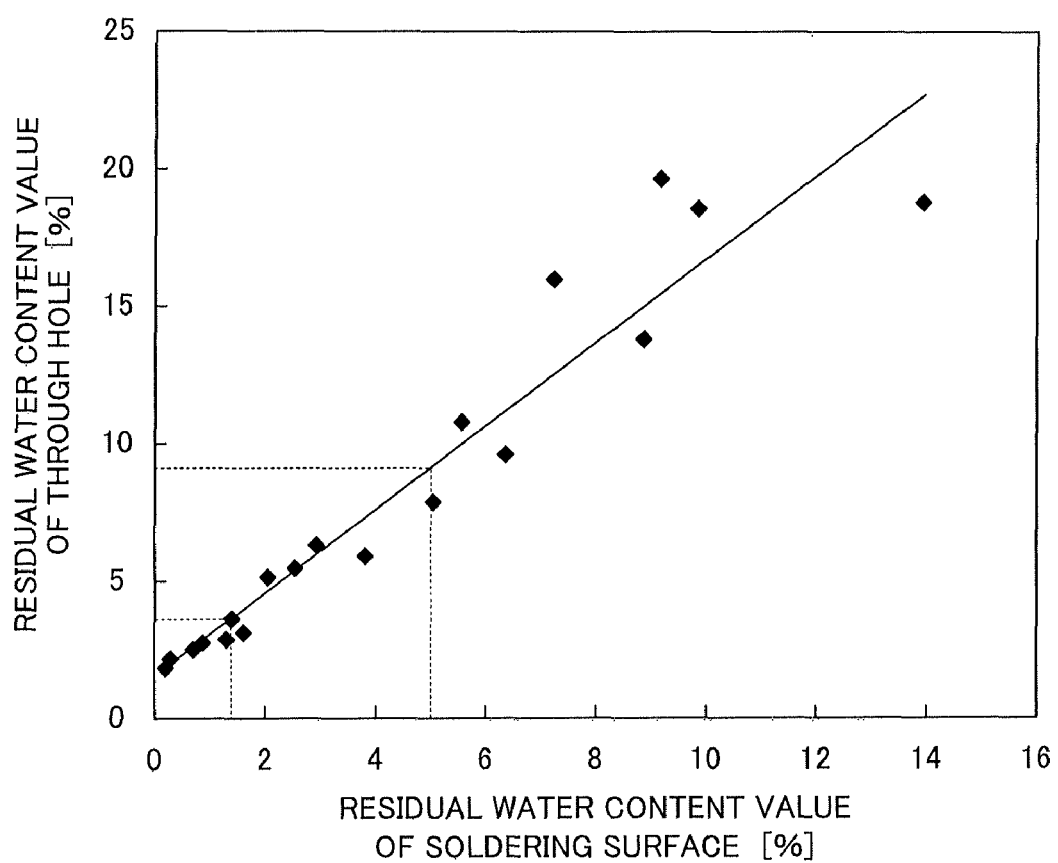
FIG. 4 is a diagram showing one example of the relationship between the residual water content value of a soldering surface and the residual water content value of the through holes according to the present embodiment.

The residual water content value of the soldering surface and the residual water content value of the through holes are measured as described above in a simultaneous fashion using a plurality of electronic circuit substrate samples, and the relationship between these residual water content values is acquired. FIG. 4 is a diagram showing one example of the relationship between the residual water content value of the soldering surface and the residual water content value of the through holes. When 30 cylindrical jigs 14 made of polyacrylate ester having a height h=1.6 mm, outer diameter D1=1.0 mm, inner diameter D2=0.7 mm and thickness t=0.15 mm were installed on a glass epoxy substrate having a thickness of 1.6 mm and a minimum through hole diameter of 1.0 mm, and furthermore, an electronic component having 0.5 mm-diameter leads was mounted, then it was found, as shown in FIG. 4, that there is a correlation which can be represented by a linear function between the residual water content value of the soldering surface and the residual water content value of the through holes.

Figure 5:
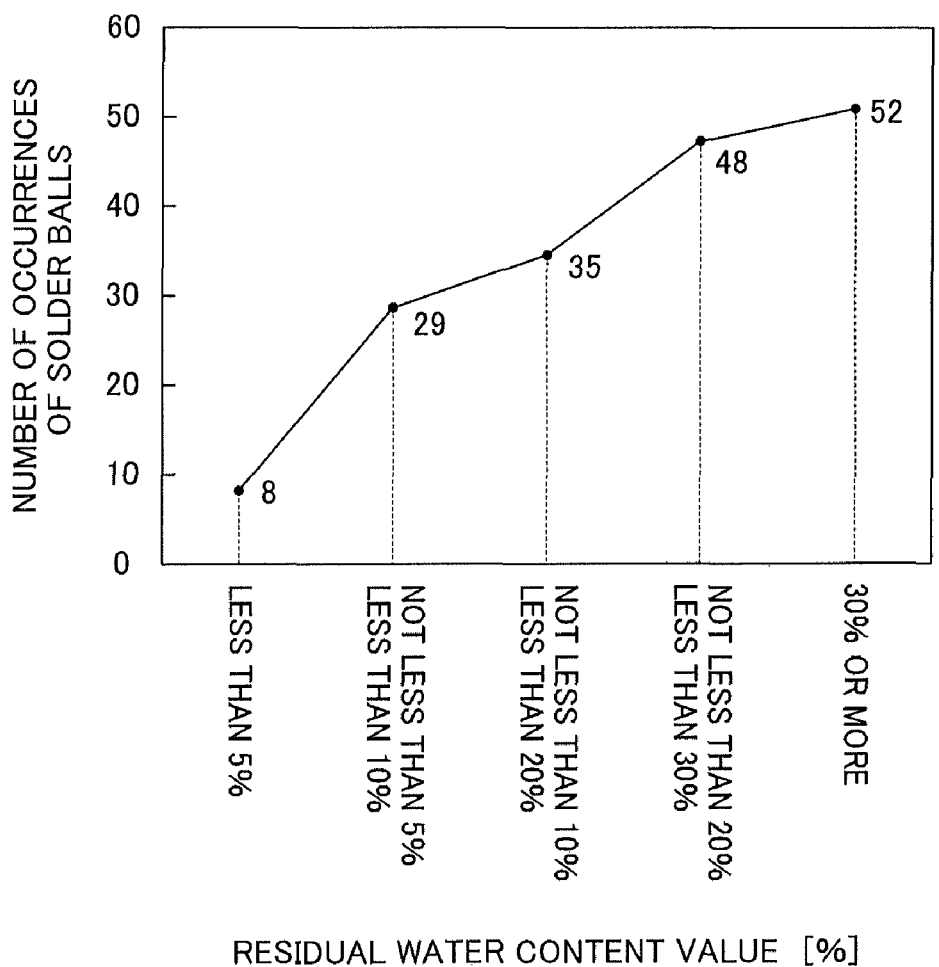
FIG. 5 is a diagram showing one example of the relationship between the residual water content value of the soldering surface and the number of occurrences of solder balls according to the present embodiment.
Figure 6:
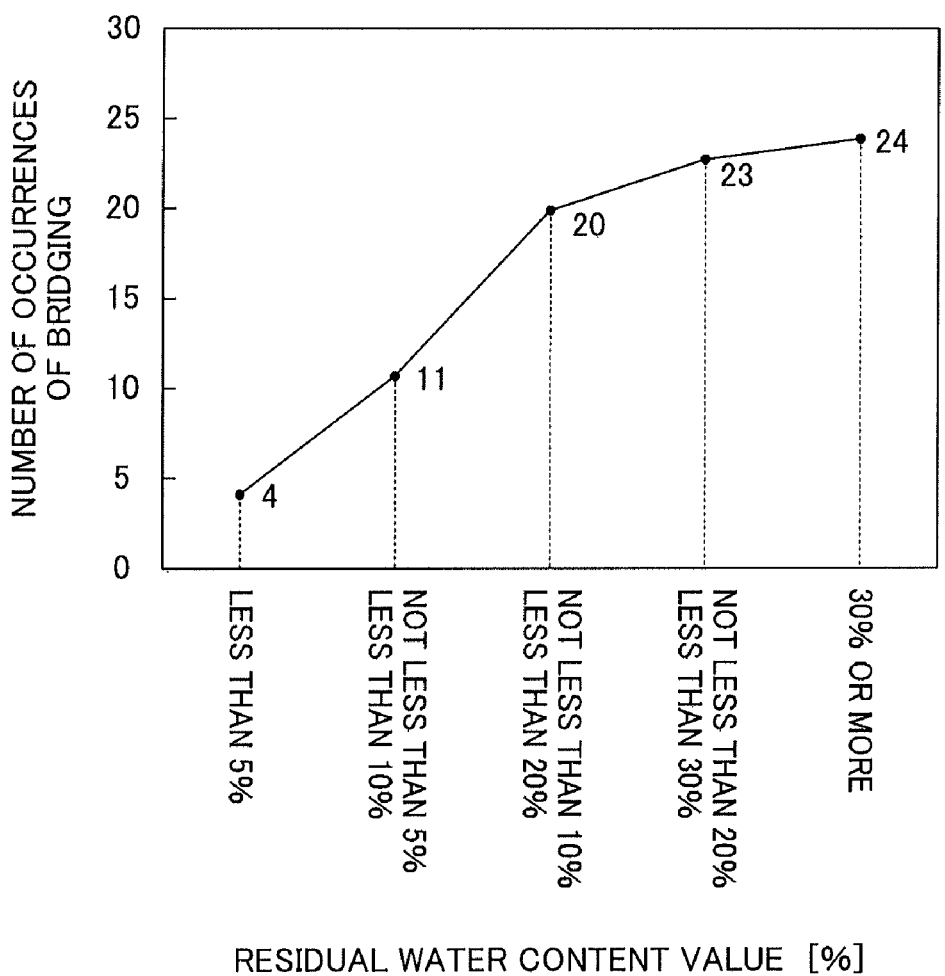
FIG. 6 is a diagram showing one example of the relationship between the residual water content value of the soldering surface and the number of occurrences of solder bridging according to the present embodiment.

Furthermore, when acquiring the correlation between the residual water content value of the soldering surface and the residual water content value of the through holes, the relationship between the residual water content value of the soldering surface and the soldering quality was also obtained. FIG. 5 is a diagram showing one example of the relationship between the residual water content value of the soldering surface and the number of occurrences of solder balls, and FIG. 6 is a diagram showing one example of the relationship between the residual water content value of the soldering surface and the number of occurrences of bridging. FIGS. 5 and 6 show the results of a case where 1000 electronic circuit substrate samples were subjected to flow soldering. Here, from the 1000 samples, the occurrence of solder balls and bridging was investigated by respectively extracting 100 samples having a residual water content value of less than 5%, 100 samples having a residual water content value equal to or greater than 5% and less than 10%, 100 samples having a residual water content value equal to or greater than 10% and less than 20%, 100 samples having a residual water content value equal to or greater than 20% and less than 30%, and 100 samples having a residual water content value equal to or greater than 30%. Furthermore, here, the number of cases where solder balls and bridging occurred was counted as one case per sample.

As shown in FIG. 5 and FIG. 6, in the samples having a residual water content value of less than 5%, the number of occurrences of solder balls was 8 and the number of occurrences of bridging was 4. Hence, the number of occurrences was relatively small both for solder balls and bridging. Furthermore, in the samples having a residual water content value equal to or greater than 5% and less than 10%, the number of occurrences of solder balls was 29 and the number of occurrences of bridging was 11. Therefore, the number of occurrences was relatively high for both solder balls and bridging.

In this way, when 30 cylindrical jigs made of polyacrylate ester having a height h=1.6 mm, outer diameter D1=1.0 mm, inner diameter D2=0.7 mm and thickness t=0.15 mm were installed on a glass epoxy substrate having a thickness of 1.6 mm and a minimum through hole diameter of 1.0 mm, and furthermore, an electronic component having 0.5 mm-diameter leads was mounted, then it was found that there is a correlation which can be represented by a linear function between the residual water content value of the soldering surface and the residual water content value of the through holes. Furthermore, it was found that, if the residual water content value of the soldering surface is less than 5%, then the residual water content value of the through holes is less than 8%, as shown in FIG. 4, and the number of occurrences of solder balls and bridging is small, as shown in FIG. 5 and FIG. 6. Consequently, from this series of relationships, if the residual water content value of the soldering surface before the application of the molten solder is less than 5%, then it can be forecast that the soldering quality is unlikely to be unsatisfactory. Therefore, if it is predicted whether or not the soldering quality will be satisfactory on the basis of whether or not the residual water content value of the soldering surface of the electronic circuit substrate is less than 5%, then it can be expected that the number of occurrences of defective substrates will decline and soldering of high quality can be achieved. In other words, in this case, the monitoring device 12 is composed in such a manner that it predicts whether or not the soldering quality will be satisfactory in accordance with whether or not the residual water content value of the soldering surface of the electronic circuit substrate is less than 5%, on the basis of the aforementioned correlation between the residual water content value of the soldering surface of a sample and the residual water content value of the through holes of the sample, and in such a manner that it adjusts the preheating profile from the residual water content value of the soldering surface.

The flow soldering method used by the flow soldering apparatus having the composition shown in FIG. 1 and described above will be explained. Here, a case is described in which a glass epoxy substrate having a thickness of 1.6 mm and minimum through hole diameter 1.0 mm is used as the electronic circuit substrate 1. In this case, as described above, the residual water content value at which it is predicted that defects are not liable to occur is defined as less than 5%.

The electronic circuit substrate 1 introduced into the apparatus is conveyed by the conveyor 2. Firstly, the electronic circuit substrate 1 passes the first preheater 3. The first preheater 3 removes the water content absorbed in the electronic circuit substrate 1 by preheating the electronic circuit substrate 1. Thereupon, the water content of the soldering surface of the electronic circuit substrate 1 is measured by the first water content sensor 4, and VOC-free flux or low-VOC flux in the form of a mist is then applied to the soldering surface of the electronic circuit substrate 1 by the fluxer 5. The residual water content of the soldering surface of the electronic circuit substrate 1 onto which the flux has been applied is measured by the third water content sensor 11. The first water content sensor 4 and the third water content sensor 11 send a signal indicating the measured residual water content to the monitoring device 12.

Thereupon, the electronic circuit substrate 1 passes the drying device 6. The drying device 6 evaporates off the water contained in the VOC-free flux or low-VOC flux that has been applied to the soldering surface of the electronic circuit substrate 1.

Thereupon, the electronic circuit substrate 1 passes the second preheater 7. The second preheater 7 activates the flux and also removes the water content remaining on the electronic circuit substrate 1 by preheating the electronic circuit substrate 1. The residual water content of the soldering surface of the electronic circuit substrate 1 is measured by the second water content sensor 8. The second water content sensor 8 sends a signal indicating the measured residual water content to the monitoring device 12.

The monitoring device 12 calculates the difference between the residual water content measured by the second water content sensor 8 and the residual water content measured by the first water content sensor 4. If the residual water content value indicated by this difference is equal to or greater than 5%, at which it is forecast that defects are liable to occur, then the monitoring device 12 causes the electronic circuit substrate to be removed from the soldering line. Moreover, the monitoring device 12 increases the heating temperature of the drying device 6 and the heating temperature of the second preheater 7. On the other hand, if the residual water content value is less than 5%, then the electronic circuit substrate 1 proceeds to the next step. In other words, the electronic circuit substrate 1 passes the jet solder tank 9 which applies molten solder onto the soldering surface, and then passes the cooler 10 which cools the electronic circuit substrate 1. By means of these steps, the soldering of the electronic circuit substrate 1 is completed.

Above, an example was described in which a glass epoxy substrate having a thickness of 1.6 mm and a minimum through hole diameter of 1.0 mm was used, but apart from glass epoxy, there are various other possible materials for the substrate, such as phenolic paper, or the like, and the thickness of the substrate, the through hole diameter and the dimensions of the substrate can be set to various different values. Furthermore, the heat capacity varies with the component density and the layout on the electronic circuit substrate. In other words, the ease of drying varies accordingly. Therefore, it is desirable to acquire the relationship between the residual water content value of the through holes and the residual water content value of the soldering surface, respectively for each type of substrate that is to be processed, and to set an appropriate residual water content value on the basis of the acquired relationship.

Furthermore, here, the monitoring device 12 was described as judging satisfactory or unsatisfactory soldering quality, and adjusting the heating temperature of the drying device 6 and the heating temperature of the second preheater 7, on the basis of the difference between the respective water content measured by the first water content sensor 4 and the second water content sensor 8, but it is also possible to add to the monitoring device 12 a mechanism which adjusts the heating temperature of the first preheater 3 from the water content measured by the first water content sensor 4, on the basis of the correlation between the residual water content value of the soldering surface of a sample and the residual water content value of the through holes of the sample. Moreover, it is also possible to add to the monitoring device 12 a mechanism which adjusts the amount of flux applied on the basis of the water content measured by the third water content sensor 11, using the correlation described above.

Furthermore, here, a case is described in which the heating temperature of the drying device 6 and the heating temperature of the second preheater 7 are adjusted, but it is also possible to adjust the heating temperature of any one of the drying device 6 and the second preheater 7.

INDUSTRIAL APPLICABILITY

The flow soldering apparatus and the flow soldering method according to the present invention can suppress the occurrence of soldering defects, as well as ensuring good soldering quality, and are especially useful in the flow soldering of an electronic circuit substrate onto which VOC-free flux or low-VOC flux is applied.

The invention claimed is:

1. A flow soldering apparatus comprising:
   a conveyor for conveying a substrate in which a plurality of through holes are formed;
   a dispenser for applying flux to the substrate;
   a soldering unit for applying molten solder to the substrate to which the flux has been applied;
   a preheating device for preheating the substrate by the time the substrate is conveyed to the soldering unit;
   a water content sensor for measuring a residual water content of a surface of the substrate; and
   a monitoring device for judging soldering quality by using a residual water content value of the surface of the substrate acquired from measuring the residual water content of the surface of the substrate with the water content sensor, on the basis of a correlation between a residual water content value of a surface of a sample substrate and a residual water content value of through holes of the sample substrate.

2. The flow soldering apparatus according to claim 1, wherein the monitoring device adjusts a heating temperature of the preheating device by using the residual water content value of the surface of the substrate as acquired from measuring the residual water content with the water content sensor, on the basis of the correlation.

3. The flow soldering apparatus according to claim 1, wherein the preheating device includes a first preheater disposed before the dispenser and a second preheater disposed after the dispenser;
   the water content sensor includes a first water content sensor for measuring a residual water content of the surface of the substrate preheated by the first preheater, and a second water content sensor for measuring a residual water content of the surface of the substrate preheated by the second preheater; and
   the monitoring device determines a difference between the residual water contents measured respectively by the first water content sensor and the second water content sensor, as a residual water content value of the surface of the substrate.

4. The flow soldering apparatus according to claim 1, wherein the residual water content value of the through holes of the sample substrate is acquired by using cylindrical jigs that are inserted into the through holes of the sample substrate.

5. The flow soldering apparatus according to claim 3, wherein the residual water content value of the through holes of the sample substrate is a difference between a residual water content measured by the first water content sensor from first cylindrical jigs previously inserted into first through holes of the sample substrate preheated by the first preheater and a residual water content measured by the second water content sensor from second cylindrical jigs previously inserted into second through holes of the sample substrate preheated by the second preheater.

6. The flow soldering apparatus according to claim 4, wherein material of the cylindrical jigs is an acrylic resin, polyvinyl resin or cotton.

7. The flow soldering apparatus according to claim 1, wherein the water content sensor is a near-infrared sensor or infrared sensor.

8. The flow soldering apparatus according to claim 1, wherein the flux is VOC-free flux or low-VOC flux.

9. A flow soldering method, comprising the steps of: applying flux to an introduced substrate;
applying molten solder to the substrate to which the flux has been applied;
preheating the substrate by the time the molten solder is applied to the substrate; and
judging, before molten solder is applied to the substrate, soldering quality from a residual water content value of a surface of the substrate, on the basis of a correlation between a residual water content value of a surface of a sample substrate and a residual water content value of through holes of the sample substrate.

10. The flow soldering method according to claim 9, further comprising adjusting a preheating profile of a subsequent substrate based on a judgment of soldering quality resulting from the step of judging, soldering quality in claim 9.

11. The flow soldering method according to claim 9, wherein the residual water content value of the surface of the substrate is a difference between a residual water content measured from the surface of a substrate that has been preheated in the step of preheating the substrate by the time the molten solder is applied to the substrate in claim 9 before the application of flux and a residual water content measured from the surface of the substrate that has been preheated after the application of flux.

12. The flow soldering method according to claim 9, wherein the residual water content value of the through holes of the sample substrate is acquired by using cylindrical jigs that are inserted into the through holes of the sample substrate.

13. The flow soldering method according to claim 9, wherein the residual water content value of the through holes of the sample substrate is acquired from a difference between a residual water content measured from first cylindrical jigs previously inserted into first through holes of the sample substrate that has been preheated before the application of flux and a residual water content measured from second cylindrical jigs previously inserted into second through holes of the sample substrate that has been preheated after the application of flux.

14. The flow soldering method according to claim 12, wherein material of the cylindrical jigs is an acrylic resin, polyvinyl resin or cotton.

15. The flow soldering method according to claim 9, wherein the residual water content value of the surface of the substrate, the residual water content value of the surface of the sample substrate, and the residual water content value of the through holes of the sample substrate are acquired by using a near-infrared sensor or infrared sensor.

16. The flow soldering method according to claim 9, wherein the flux is VOC-free flux or low-VOC flux.

* * * * *